(12) United States Patent
Fryette

(10) Patent No.: US 6,759,901 B2
(45) Date of Patent: Jul. 6, 2004

(54) DYNAMIC SENSING REGULATOR

(75) Inventor: Steven M Fryette, Los Angeles, CA (US)

(73) Assignee: VHT Amplification, Inc., Sun Valley, CA (US)

( * ) Notice: Subject to any disclaimer, the term of this patent is extended or adjusted under 35 U.S.C. 154(b) by 0 days.

(21) Appl. No.: 10/301,016

(22) Filed: Nov. 21, 2002

(65) Prior Publication Data

US 2004/0100324 A1 May 27, 2004

(51) Int. Cl.[7] .............................. H03G 3/00; H03F 3/28
(52) U.S. Cl. ..................................... 330/127; 330/123
(58) Field of Search ................................. 330/127, 123

(56) References Cited

U.S. PATENT DOCUMENTS

| | | | |
|---|---|---|---|
| 4,392,103 A | | 7/1983 | O'Sullivan et al. |
| 4,816,741 A | * | 3/1989 | Ekstrand ..................... 323/297 |
| 5,635,872 A | | 6/1997 | Zimmerman |
| 5,761,316 A | * | 6/1998 | Pritchard ..................... 381/61 |
| 5,777,519 A | * | 7/1998 | Simopoulos ................. 330/297 |
| 5,909,145 A | | 6/1999 | Zimmerman |
| 5,977,474 A | * | 11/1999 | O'Brien ....................... 84/735 |
| 6,350,943 B1 | * | 2/2002 | Suruga et al. ................ 84/603 |

\* cited by examiner

Primary Examiner—Patricia Nguyen
(74) Attorney, Agent, or Firm—Amin & Turocy, LLP; Eric D. Jorgenson

(57) ABSTRACT

A dynamic sensor regulator that provides a mechanism for introducing desirable tonal artifacts in component-based guitar amplifier systems by inducing voltage fluctuations into the power supply of a preamplifier. The dynamic sensor regulator comprises a regulator circuit, connected to an amplifier that is connected to a converter circuit that is connected to a variable control circuit. The amplifier includes a floating bias circuit that dynamically adjusts the bias state of an output driving amplifier in response to signal fluctuations of the regulator output signal. A transformer is connected to the amplifier output and once the transformer's saturation point has been reached, the saturation of the transformer increases proportionally with the amplifier's input signal while the regulated output signal remains constant, emulating amplifier overload and saturation.

22 Claims, 4 Drawing Sheets

DYNAMIC SENSING REGULATOR

BACKGROUND OF THE INVENTION

This invention is related to voltage sensing regulators, and more particularly to an application of such a regulator in music amplifier systems.

Of primary importance to guitar players is the sound of the guitar amplifier, considered to be an integral part of the artists instrument, that instrument being comprised of the guitar, the amplifier, speakers, and any other sound modifier or signal processors included in the signal chain. Traditionally, the guitar amplifier, in general, and the tube amplifier, in particular, not only amplifies the signal from the guitar, but also adds additional sonic characteristics, such as adjustable treble and bass enhancements and harmonic distortion generated by overloading the vacuum tubes, transformers, and speakers.

In a vacuum tube guitar amplifier, pleasing distortion components are added to the amplified sound in varying degrees, based upon the settings and preferences of the user. As amplifier technology has become more sophisticated, the range of tonal variation has become significantly enhanced. There are other more subtle characteristics of guitar amplifier behavior to be explored and brought under control of the user.

One such behavioral characteristic of particular interest is actually more of an anomaly or artifact of an amplifier being purposely overloaded with respect to its power supply. A self-contained, or integrated amplifier is composed of three main blocks: the preamplifier (also denoted as "preamp"), which amplifies the very low level guitar signal to a level, required by the next block; the power amplifier, which amplifies the low level signal output of the preamplifier to a higher level sufficient to drive the speakers; and the power supply, which provides the voltage and current needed for the other component parts to operate according to design requirements. The power supply is part of the amplifier that converts AC input voltage to DC voltages required by the various components and amplifier circuits. As the amplifier volume is increased past normal operating parameters, the power supply becomes unable to meet the demands placed on it by the amplifier circuit. This causes the amplifier power supply voltage to drop below its normal reserve. In response, the amplifier output signal causes the audio output from the speakers to sound compressed or "spongy". In addition, constant fluctuation of the power supply potential introduces Inter-modulation Distortion (IMD) into the audio signal-and produces a sonic artifact commonly referred to as a "ghost note." Ghost notes are a phenomenon that occurs when the frequency of the IMD component modulates or beats against the fundamental audio signal being amplified, creating a harmonic undertone, which is perceived as an additional tone or note. While these artifacts may be undesirable from a technical standpoint, and are easily eliminated, they are part-and-parcel to the playing experience of the musician.

A third important artifact produced by overloading a conventional vacuum tube amplifier system is Output Transformer Core Saturation. This occurs when the output transformer, the component that couples the high impedance of the output tube(s) to the low impedance speaker load, has surpassed its capability to faithfully transfer the output signal from the power tube to the speaker load, due to the limitation of the magnetic flux created in the transformer core. Transformer saturation produces a subtle but audible form of compression of the output signal.

In component-based systems where the preamplifier and amplifier are each constructed in an individual chassis, the preamplifier operates independently of the power amplifier insofar as each chassis provides a power supply that supports only the circuits contained within that chassis. Because of this independence, the "floating" preamplifier voltages and attendant artifacts are eliminated, causing the preamplifier to output clearer signals, which sound dry, brittle, and lifeless compared to the integrated amplifier system.

Although many other manufacturers have offered preamplifiers to the market, there has always been a missing element that prevents these products from being widely accepted as "the real thing" in terms of their being able to replicate all of the various characteristics of integrated guitar amplifiers, especially with respect to the aforementioned artifacts.

Preamplifier circuitry as currently understood, is incapable of producing genuine power supply induced behavioral artifacts due to the nature of the preamp tubes themselves. Preamp tubes operate in Class A mode, a term used to describe the difference in power consumption under zero signal condition versus maximum signal condition. In Class A mode, there is no significant difference in power consumption between the aforementioned conditions of operation and therefore the power supply voltage stays constant. An integrated vacuum tube guitar amplifier consists of preamp tubes and power tubes. The power tubes are responsible for delivering the fully amplified sound to the speakers and therefore do all the "work". This means they also consume 95% of all the available power in the power supply. Mostly, power tubes operate in Class AB mode. This simply means that very little demand is made upon the power supply under zero signal condition and maximum demand is made upon the power supply during maximum signal condition. The artifacts described above are caused by the radical fluctuation in power requirement between the zero signal and maximum signal condition. Because the preamp tubes are operated from the same supply source as the power tubes in an integrated amplifier, the preamp section "floats" along with the constantly shifting voltage potential of the power supply during conditions of rigorous operation.

What is needed is an architecture that emulates the desirable tonal artifacts in component-based guitar amplifier systems that were previously produced in integrated guitar amplifier systems.

SUMMARY OF THE INVENTION

The present invention disclosed and claimed herein, in one aspect thereof, comprises a power supply control circuit in a preamplifier component. The component comprises a power supply for providing a power signal. A regulator circuit receives the power signal and a regulator control signal, and provides a regulated output signal. An amplifier circuit operates from the regulated output signal, receives an input signal, and outputs an amplifier output signal. A converter receives the amplifier output signal and converts the amplifier output signal to a control voltage. A variable control circuit receives the control voltage, and varies the control voltage to output the regulated control signal to the regulator circuit. When a signal fluctuation occurs in the input signal, a corresponding signal fluctuation is induced in the regulated output signal in response thereto causing a random distortion in the amplifier output signal that is perceived by a listener as audio artifacts in the amplifier output signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

The disclosed dynamic regulator sensor (DSR) invention provides a mechanism for introducing the desirable tonal artifacts into component-based guitar amplifier systems that were previously restricted to integrated guitar amplifiers. The DSR solves this problem by inducing voltage fluctuation in the power supply of the preamplifier causing emulation of the effects produced in a conventional integrated amplifier when reacting to the varying signal strength introduced into the preamplifier by the musical instrument (e.g., a guitar). In accordance with the disclosed DSR implementation, the integrated guitar preamplifier and power amplifier system can now be marketed as separate components, similar in concept to a high-end component-based home stereo system, while maintaining the desirable artifacts found conventionally in integrated systems.

Figure 1:
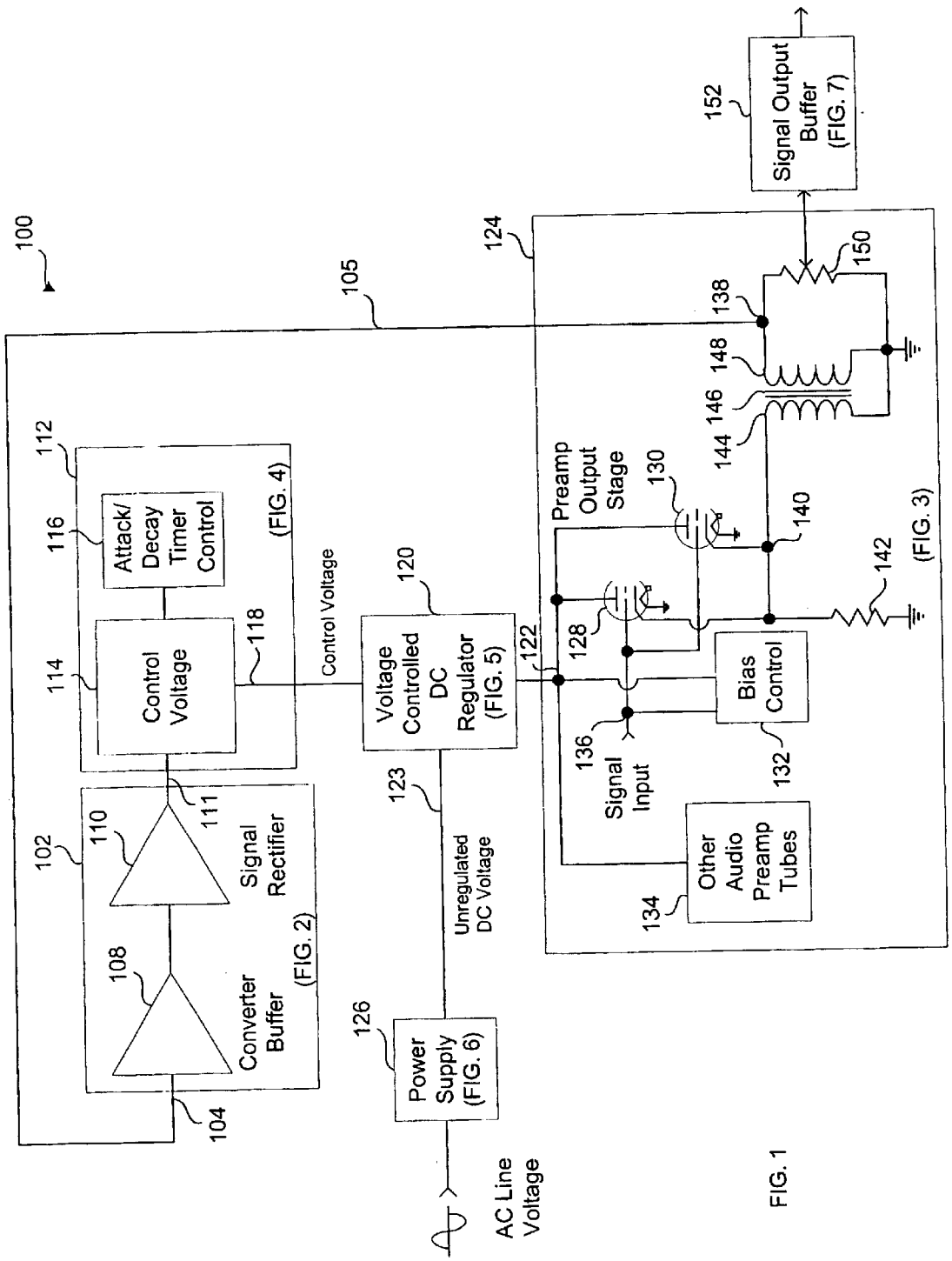
FIG. 1 illustrates a general circuit block diagram of a dynamic sensing regulator, according to a disclosed embodiment.

Referring now to FIG. 1, there is illustrated a circuit block diagram of a dynamic sensing regulator in a preamplifier chassis of a component-based system, according to a disclosed embodiment. As a general overview of this particular embodiment, a preamplifier power supply is first fixed at a specific and constant voltage (or "regulated" voltage) utilizing a voltage regulator circuit that is externally controlled. The means to control the regulator output voltage is a DC control voltage. The DC control voltage is derived from the active audio signal, which is first isolated from the audio signal path using a "buffer," and then rectified or converted to a control voltage. The control voltage is then stored by a variable R/C network, which allows the operator to vary the control voltage amplitude and speed (i.e., frequency) at which the control voltage affects the output of voltage regulator. The user-adjustable nature of this system is preferable, since in an integrated amplifier the intensity of the artifacts varies with the load placed on the amplifier (loudness). Therefore the DSR must have a means to emulate the variable nature of this effect as well.

When a low level signal is present at the preamplifier input, there is a correspondingly small response from the voltage regulator. In the same way, an integrated amplifier will generate very little unusual behavior when operated within normal levels. However with a very strong input signal, there will be a correspondingly large reaction in the sensing and regulator system, which causes a deep drop in the power supply voltage, just as would happen in an integrated amplifier. The ensuing development of the generated artifacts is not only noticeably greater, but they are user controllable in order to minimize or maximize the effect to the user'taste.

In operation, the first input stage of the DSR 100 comprises an audio-to-control-voltage converter circuit 102, which is described in greater detail hereinbelow with respect to FIG. 2. The converter circuit 102 receives the audio signal at a converter input 104, which audio signal is fed back from an output point of a preamp section 124 via an audio feedback connection 105. The preamp section 124 is described in greater detail hereinbelow with respect to FIG. 3. The converter input 104 is the input to a converter buffer 108 of the, converter circuit 102, which converter buffer 108 is utilized for isolating the electronics of the converter circuit 102 from the preamp section 124 electronics. The output of the converter buffer 108 connects to an input of a signal rectifier circuit 110 for rectifying the audio signal for later stages of the sensing electronics.

The output of the signal rectifier circuit 110 connects to an input of a voltage-control-and attack decay circuit 112 via an interconnect 111, which circuit 112 stores control voltage therein and provides user control of the control voltage via a variable RC network. The voltage-control-and attack/decay circuit 112 is described in greater detail hereinbelow with respect to FIG. 4. The voltage-control-and-attack/decay circuit 112 comprises a control voltage block 114 that receives the output of the signal rectifier circuit 110. The variable RC network is included in a timer block 116, and connects to the control voltage block 114 to provide user control of the control voltage block 114 by varying the signal amplitude and frequency (or speed) parameters provided at a control voltage output 118.

The control voltage output 118 connects to a control input of a voltage controlled DC regulator 120 to facilitate control of a DC regulator output 122. The regulator circuit 120 is described in greater detail hereinbelow with respect to FIG. 5. The DC regulator 120 has a DC power input 123 receiving raw, stepped-up, and rectified line voltage (e.g., 450 VDC) from a preamplifier power supply 126 described in greater detail hereinbelow with respect to FIG. 6. The unregulated supply voltage provided to the regulator 120 at the DC power input 123 is varied at the regulated output node 122 in response to the variable input control 116 to dynamically regulate DC power provided to circuit elements of the preamplifier section 124. In this particular embodiment, where the supply voltage from the power supply 126 is an unregulated 450 VDC to the regulator 120, the voltage at the regulated output node 122 may vary from approximately 285 to 350 VDC, depending on the signal strength from the preamp section 124 and the attack/decay setting of the variable control input 116.

As mentioned hereinabove, the DC regulator 120 provides regulated voltage at the output node 122, which is the regulated node to the preamplifier section 124. Power-consuming circuits of the preamplifier section 124 that connect to the regulated output node 122 include a preamp output tube stage (comprising triode tubes 128 and 130), a bias control network 132 that also connects to effect control to the plates and grids of the triode tubes (128 and 130), and a tube block 134 comprising other tubes in the preamplifier section 124.

More particularly, an input to the bias control circuit 132 is the voltage from the regulated node 122 that allows the operator to adjust the bias to the grids of the output stage tubes (128 and 130) at a bias node 136. The bias node 136 is also the input connection for the audio signal input to the system 100. The grid bias node 136 connects in parallel to the grids of the output stage tubes (128 and 130). The regulated voltage node 122 connects to each of the plates of the output stage tubes (128 and 130). The cathodes of the output stage tubes (128 and 130) connect to a cathode node 140, which further connects to ground through a resistor 142. This determines the bias state of the audio output signal at an audio signal output node 140 of the preamp section 124. The output stage tube grids self-adjust out-of-sync with the corresponding shift in the output of the voltage controller DC regulator 120 (caused by the action of the control voltage 114, in accordance with the signal received from circuit 102 and modified by circuit 116) due to the additional time constant provided by circuit elements of the bias control circuit 132. The bias circuit 132 also determines the current flow from the plate to cathode of each of the output stage tubes (128 and 130) by providing a positive potential to the grid connection such that current is controlled causing signal clipping to vary independently of the output state, thereby inducing random, erratic distortion artifacts that are typically observed in conventional overloaded integrated guitar amplifier system. The cathode heaters for each of the output stage tubes (128 and 130) connect to ground at one terminal, and to a heater control circuit (not shown) to facilitate electron flow off the cathodes.

The cathode node 140 is also connects to the input terminal of the primary winding 144 of an energy conversion element in the form of an audio output transformer 146. The output terminal of the primary winding 144 connects to ground. The varying audio signal at the cathode node 140 is coupled from the primary winding 144 to the secondary winding 148 of the audio transformer 146, the secondary winding 148 connecting across an output potentiometer 150 from the audio output node 138 to ground. The audio output feedback connection 105 connects to the audio output node 138 to feed the audio output signal back to the input of the converter buffer 108 at the buffer input 104. The output potentiometer 150 connects across the secondary winding 148 from the secondary current output terminal of the audio output node 138 to ground.

The operator can adjust the amount of audio output signal of the preamp section 124 to the following output buffer block 152 utilizing the potentiometer 150. The output buffer block 152 is described in greater detail hereinbelow with respect to FIG. 7.

The output signal of the transformer secondary winding 148 increases in amplitude in direct proportion to the amplitude of the signal input to the signal input 136 of the vacuum tube output stage comprising triodes 128 and 130, until saturation of the transformer 146 is reached. Thereafter, saturation increases proportionally with the signal input to the signal input 136 while the control signal at regulator node 122 remains substantially constant, causing emulation of power amplifier saturation and overload that produce the desired artifacts.

Figure 2:
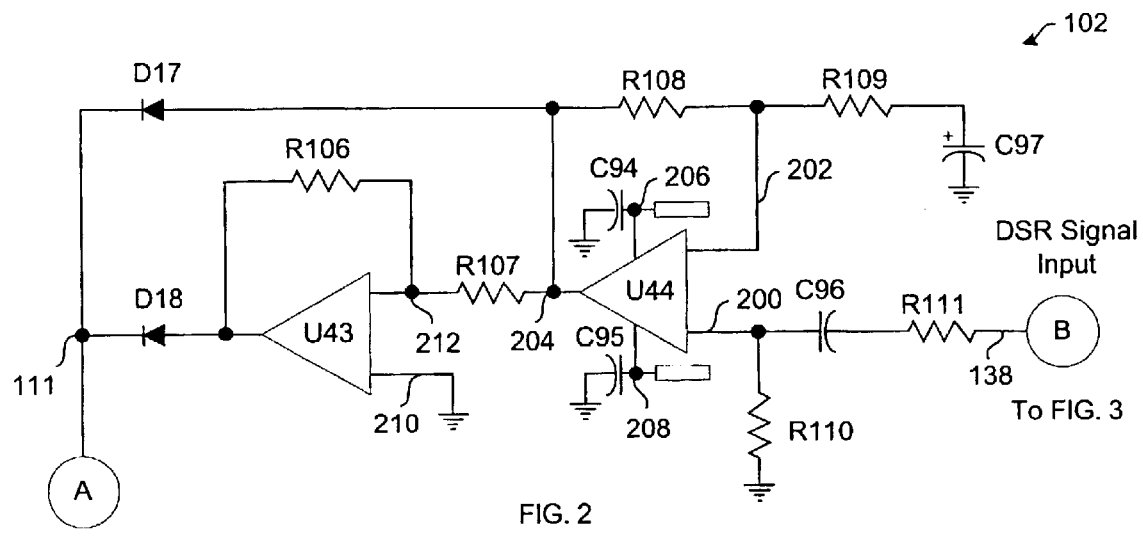
FIG. 2 illustrates a detailed schematic diagram of the audio-to-control-voltage converter circuit of the general block diagram of FIG. 1.

Referring now to FIG. 2, there is illustrated a detailed schematic diagram of the audio-to-control-voltage converter circuit 102 of the general block diagram of FIG. 1. As mentioned hereinabove, the output of this circuit 102 is electrically node 112 that connects to a drawing Terminal A indicating the transition to FIG. 4. The input to this circuit 102 is electrically node 138 associated with the drawing Terminal B receiving the input current from FIG. 3.

The first stage of the audio-to-control voltage converter 102 is an amplifier U44 configured as the converter buffer 108 having as an input to one terminal a capacitor/resistor network. The network comprises a resistor 111 extending from the node 138 in series with a capacitor C96 both of which are in series with a first input terminal 200 of amplifier U44. The capacitor C96 is an AC coupling capacitor on the input of the amplifier U44 such that the first stage is an AC coupled feedback amplifier to the output of the preamplifier tube circuit 124 described in detail hereinbelow in FIG. 3. A bias resistor R110 extends from the first input terminal 200 of the amplifier U44 to ground. The amplifier U44 is connected in a non-inverting configuration such that the polarity of the output is the same as the polarity of the first input 200. Thus, the second input terminal 202 of amplifier U44 is the inverting input. The second input 202 of amplifier U44 has connected thereto a resistor R109 in series with a polarized capacitor C97 to ground. The feedback loop from the second input 202 connects to a resistor R108 to an output terminal 204 of the amplifier U44, which is also one terminal of resistor R107 leading to the later signal rectifying stage 110. The feedback components set the gain at this stage. The amplifier U44 has a positive supply terminal 206 with a bypass capacitor C94 connected therefrom to ground, and a negative supply terminal 208 with a second bypass capacitor C95 connected therefrom to ground.

The second stage is the signal rectifier stage 110 and comprises the amplifier U43, having a first non-inverting input 210 connected to ground. The second input 212 connects to the other terminal of resistor R107 from the output of amplifier U44. The output of the second amplifier U43 connects to the anode of a diode D18, the cathode thereof being electrically the same as node 111. The output of amplifier U44 also connects to the anode of another diode D17, whose cathode also connects to node 111. Diodes D17 and D18 form a full wave rectifier.

Circuit elements for this particular embodiment include the following values: resistor R111 is 1KΩ; capacitor C96 is 0.1 µF; resistor R110 is 1M Ω; capacitor C97 is 1 µF; resistor R109 is 10 KΩ; resistor R108 is 100 KΩ; capacitor C95 is 0.1 µF; capacitor C94 is 0.1 µF; amplifiers U43 and U44 are a model TL072; resistor R107 is 10 KΩ; resistor R106 is 10 KΩ; and diodes D17 and D18 are of a type IN914B, or other suitable diode.

Figure 4:
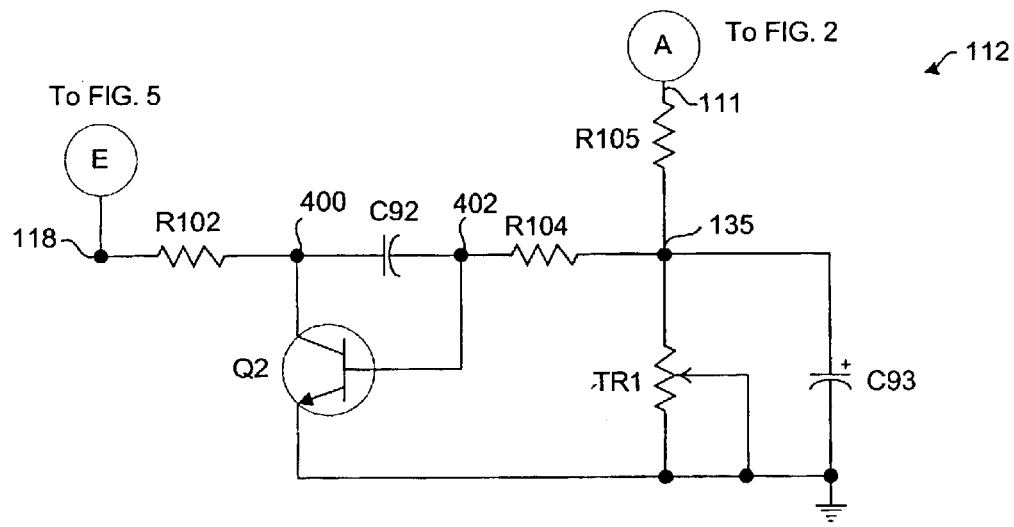
FIG. 4 illustrates a detailed schematic diagram of the voltage-control-and attack/delay circuit of the general block diagram of FIG. 1.

Referring now to FIG. 4, there is illustrated the schematic diagram of the control voltage-attack/decay timer control circuit 112 of FIG. 1. As mentioned hereinabove, the output of the control circuit 112 is essentially drawing Terminal E at node 118, providing the adjustment voltage to the voltage control regulator circuit 120 of FIG. 5. Input to the circuit is at a drawing Terminal A coming from FIG. 2. The drawing Terminal A is electrically the same as node 111, which has a resistor R105 in series to a node 135. From node 135 to ground is connected a polarized capacitor C93. Resistor R105 is used in conjunction with a resistor R104 and a potentiometer TR1 to bias the base-emitter of a transistor Q2. That is, the RC time constant from the parallel capacitor C93 and the potentiometer TR1 affects the bias of the transistor Q2, thus causing the output of the transistor Q2 to affect the adjustment terminal at node 118 of the regulator U11 of FIG. 5. The wiper and one terminal of the potentiometer TR1, the emitter of transistor Q2, and one terminal of resistor R103, all connect to ground. Current to the transistor Q2 is provided at the node 118. A capacitor C92 connects from the collector (a node 400) of transistor Q2 to the base (a node 402), which is also one terminal of resistor R104. Resistor R104 connects from node 402 to node 135. A resistor R102 connects from the collector node 400 to the output node 118. Values for the circuit elements of this particular embodiment are as follows: resistor R102 is 470 KΩ; capacitor C92 is 1,000 pF; transistor Q2 is a 2N3439; resistor R104 is 10 KΩ; resistor R105 is 4.7; KΩ; capacitor C93 is 1 μF; and potentiometer TR1 is 10 KΩ.

Figure 5:
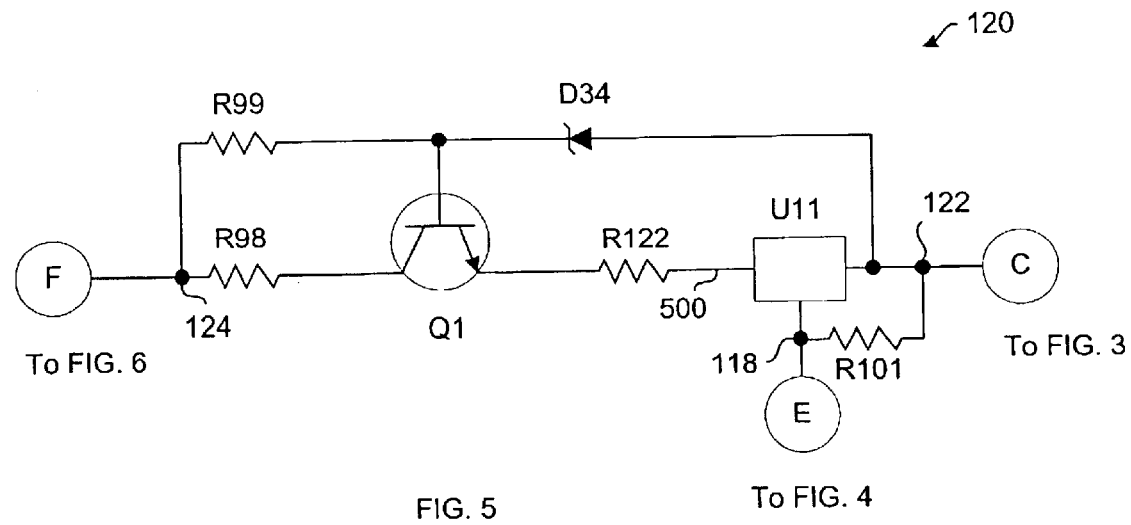
FIG. 5 illustrates a detailed schematic diagram of the regulator circuit of the general block diagram of FIG. 1.
Figure 6:
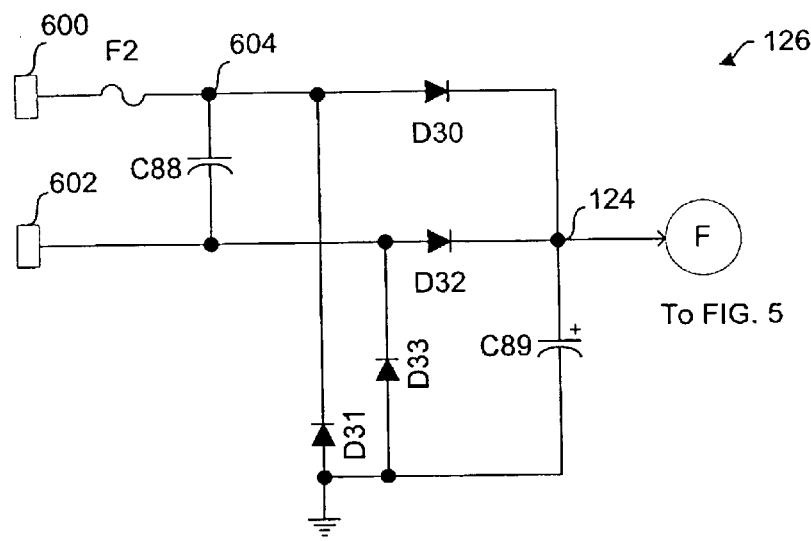
FIG. 6 illustrates a detailed schematic diagram of the preamplifier power supply of the general block diagram of FIG. 1.

Referring now to FIG. 6, there is illustrated a conventional diode bridge full wave rectifier circuit of the power supply 126 of FIG. 1. In series with a high side input 600 is an in-line fuse F2 for protecting the circuit in case of power overloads. Connected across the high side input 600 to a low side input 602 from the inside fuse terminal (at a node 604) is a snubber capacitor C88 to eliminate charging spikes generated by the diode rectifier circuit. Continuing on from the node 604, the anode of a forward-biased diode D30 connects to the node 604 with its cathode connected to the output node 124. Similarly, there is a forward biased diode D32 having its anode to the low side input terminal 602 having its cathode connected to the output node 124. Completing the diode bridge, there is a diode D31 having its anode connected to ground such that its cathode is connected to the anode of diode D30 (electrically, the node 604). The fourth diode D33 has its anode also connected to ground in common with the anode of diode D31, and its cathode connected to the anode of D32 (electrically, the node 602). A polarized charging capacitor C89 is connected from the output node 124 across to ground (which is also the anodes of both diodes D131 and D33). The output node 124 connects to a drawing Terminal F, which indicates transition to FIG. 5 that is the voltage control DC supply regulator circuitry 120. Note that the output of the diode bridge circuit ranges from 400 to 450 volts DC, which is input to the voltage control DC supply regulator circuit 120. Values of the circuit elements of the power supply are as follows: each of the four diodes D30, D31, D32, and D33 are IN4007; the fuse F2 is 100 mA; capacitor C88 is 0.01 μF; and capacitor C89 is a 32 μF, 450volt capacitor.

Referring now to FIG. 5, there is illustrated the voltage control DC supply regulator circuit 120 of FIG. 1. The drawing Terminal F connects to the node 124 of FIG. 5, which is electrically the same as node 124 of FIG. 6. The voltage controlled regulator circuit 120 utilizes power transistor Q1 and a three-terminal adjustable regulator U11 configured in a floating mode. This is a conventional configuration in high voltage adjustable power supplies. In this configuration, the three-terminal device U11 sees only the voltage differential from the input terminal 500 to the output at node 122. A clamping element in the form of a Zener diode D34 is placed across the input-output of device U11 in order to provide operation of the 3-terminal regulator within its specified parameters, and in order to provide a stable reference to the base of the pass transistor Q1. The power transistor Q1, in this particular embodiment is an NPN transistor having its collector connected to the output node 124 of the power supply circuit FIG. 6 through a series resistor R98. In parallel with resistor R98 across to the base of the transistor Q1 is a resistor R99. The Zener diode D34 is reverse biased from the base of transistor Q1 to the output of the three-terminal regulator U11 in that the diode D34 cathode connects to the base of transistor Q1 while the anode connects to the output of the regulator U11, which is the node 122. A series resistance R122 connects from the emitter of transistor Q1 to the input terminal 500 of the three-terminal regulator U11. An adjustment terminal of the three-terminal regulator U11 is electrically the node 118, which connects to a drawing Terminal E leading to FIG. 4 (and which is the output of the control voltage-attack/delay timer control circuit for adjusting the output of the three-terminal regulator U11). A resistance R101 connects across from the adjustment node 118 to the output node 122 to function as a reference voltage to set the static output voltage of U11. A resistor R103 connects from node 118 to ground. Node 118 also is a point of transition to FIG. 4, via drawing Terminal E. Values for the voltage controlled regulator circuit of FIG. 5 are as follows: resistor R99 is 22KΩ; resistor R98 is 100Ω; resistor R100 is 47Ω; resistor R103 is 100 KΩ; diode D34 is a type IN4735; the three-terminal Regulator U11 is an LM317TB; and resistor R101 is 360Ω.

Figure 3:
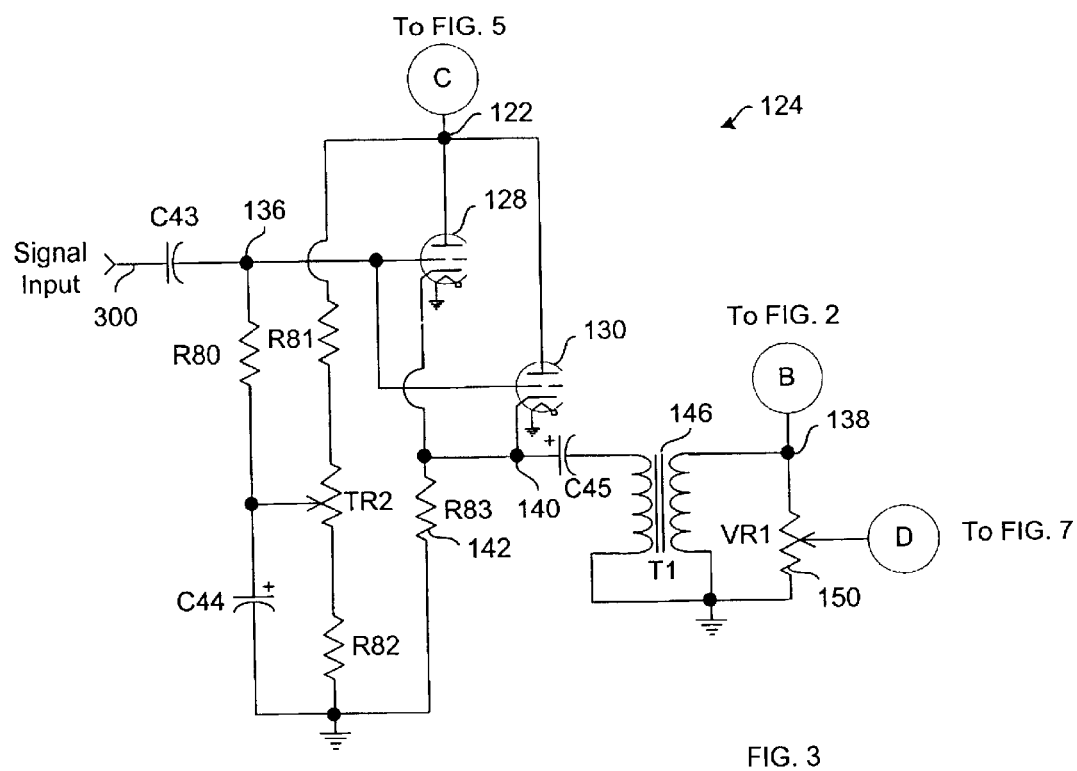
FIG. 3 illustrates a detailed schematic diagram of the preamplifier output section of the general block diagram of FIG, 1.

Referring now to the FIG. 3, there is illustrated the tube preamplifier and output section 124 in a transformer coupled cathode follower configuration. Power to the plates of triode tubes 128 and 130 is provided from the node 122, which is the drawing Terminal C of FIG. 5. This is electrically the same as the output of the three-terminal regulator U11 of FIG. A resistor network also connects from node 122 across a potentiometer TR2 to ground. That is, from node 122 connects a resistor R81 in series across the resistance element of potentiometer TR2, and further in series with a resistor R82 to ground. The wiper of the potentiometer TR2 connects to the signal input 300 via a resistor R80. The signal input 300 is AC coupled to a node 136 via a capacitor C43. The wiper of the potentiometer TR2 also connects to a polarized capacitor C44 to ground.

The cathodes of the triode tubes 128 and 130 connect in common at a node 140 and therefrom across a resistor R83 to ground. That is, one terminal of resistor R83, one terminal of resistor R82, and one plate of capacitor C44 connect in common to ground. The signal input 300 effects the amount of current flowing from the plate to the cathode of each triode tube 128 and 130 thus effecting current flow across from the plate to the cathode in accordance with the signal input at the input node 136. The cathodes of triode tubes 128 and 130 also connect to a polarized capacitor C45, the negative terminal connecting to the primary of a transformer T1 (same as transformer 146 of FIG. 1). The secondary winding of transformer T1 connects on the high side to the output node 138, which is electrically the same as the drawing Terminal B that leads to FIG. 2. Thus, the voltage from node 138 is the input to the converter/signal rectifier circuit 102 of FIG. 2. The low side of the primary and the secondary connect in common to ground. Connected across the secondary winding from the node 138 to ground is a variable resistance VR1 that provides a load on the secondary of output transformer T1 and an adjustable output to the signal output buffer stage 152 of FIG. 7. Thus, the drawing Terminal D that connects to the wiper of the variable resistance VR1, links to FIG. 7. Sample values for the circuit elements of FIG. 3, include the following: capacitor C43 is 0.022 μF; resistors R82 and R83, and potentiometer TR2 are 100 K Ω; resistor R81 is 200 KΩ; resistor R80 is 1MΩ; capacitor C44 is 1 μ; capacitor C45 is 4.7 μF; triode tubes 128 and 130 are model 12AX7, and the audio transformer 146, a model 116-00002manufactured by VHT Amplification, Inc., of Sun Valley, Calif.

Figure 7:
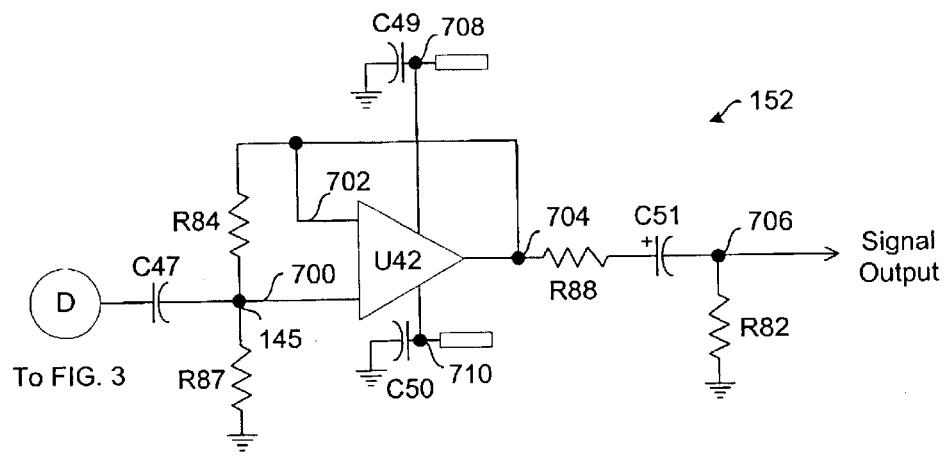
FIG. 7 illustrates a detailed schematic diagram of the output buffer block of the general block diagram of FIG. 1.

Referring now to FIG. 7, there is illustrated the signal output buffer stage 152. As indicated hereinabove, the output buffer stage 152 is capacitively coupled to the node 145 via the capacitor C47. Node 145 is also a non-inverting input 700 to an amplifier U42 that is configured as a buffer driver stage for driving the output signal to a subsequent power amplifier or signal processing device (not shown). A bias resistor R87 connects from node 145 to ground. An output 704 of amplifier U42 connects to a series resistor R88, which is further in series with a polarized capacitor C51 to AC couple an output node 706 to a power amplifier stage at the signal output. A load resistor R82 connects from the output node 706 to ground. The second input terminal 702 is electrically the same as amplifier output 704 such that the amplifier U42 provides a unity gain buffer driving function to an amplifier stage (not shown). The amplifier U42 has a positive supply terminal 708 with a bypass capacitor C49 connected therefrom to ground, and a negative supply terminal 710 with a second bypass. capacitor C50 connected therefrom to ground. Representative values for the circuit elements of FIG. 7 of the signal output buffer stage 152 include the following: capacitor C47 is 0.22$\mu$F; resistor R87 is 1M$\Omega$; resistor R88 is 100$\Omega$; amplifier U42 is a type LM833N; capacitor C51 is 10 $\mu$F; resistor R82 is 100 K $\Omega$; and the bypass capacitors C49 and C50 are 0.1 $\Omega$F.

Note that the DSR is not limited to a single channel, but may be designed to accommodate multiple channels of input signals.

This represents the general nature of the implementation although there are variations of the configuration that can be utilized, modified or added to the system. For example, the variable voltage controller output (attack/decay) can be converted into digital bits of information and stored in a memory device for later processing using a microprocessor, or "programmed" for specific times or amounts of effect.

Additionally, the control voltage to the regulator 116 can be derived from a remote source, or sent to a remote location in a "side chain" configuration for more complex systems or processing, such as insuring the repeatability of a specific artifact during multi-track recording.

Another embodiment includes sending the control voltage value over a network, for example, a global communication network such as the Internet, for use at a remote location by a similar device suitably configured to receive such a value in an otherwise entirely isolated sound system.

Although the preferred embodiment has been described in detail, it should be understood that various changes, substitutions and alterations can be made therein without departing from the spirit and scope of the invention as defined by the appended claims.

What is claimed is:

1. A power supply control circuit in a preamplifier component, comprising:
   a power supply for producing a power signal;
   a regulator circuit for receiving the power signal and a regulator control signal, and for producing a regulated output signal;
   an amplifier circuit operating with the regulated output signal and receiving an input signal, the amplifier circuit outputting an amplifier output signal;
   a converter circuit for receiving the amplifier output signal and converting the amplifier output signal to a control voltage, converter circuit includes a buffer that isolates the control voltage from the amplifier output signal; and
   a variable control circuit for receiving the control voltage, and varying the control voltage to output the regulated control signal to the regulator circuit;
   wherein a signal fluctuation is induced in the regulated output signal in response to a corresponding signal fluctuation of the input signal.

2. The circuit of claim 1, wherein the regulated output voltage is controlled with the control voltage, which is a DC control voltage.

3. The circuit of claim 2, wherein the DC control voltage is derived from the input signals, which input signal is an audio signal.

4. The circuit of claim 1, wherein the control voltage is stored in the variable control circuit, which is an R/C network.

5. The circuit of claim 4, wherein the R/C network allows an operator to vary signal amplitude and signal frequency at which the control voltage acts upon the regulator circuit.

6. The circuit of claim 1, wherein a small signal fluctuation in the input signal causes a corresponding small signal fluctuation in the regulated output signal.

7. The circuit of claim 1, wherein a large signal fluctuation in the input signal causes a corresponding large signal fluctuation in the regulated output signal.

8. The circuit of claim 1, wherein the amplifier circuit includes a floating bias circuit that adjusts dynamically the bias state of an output driving amplifier of the amplifier circuit in response to the signal fluctuation of the regulated output signal.

9. The circuit of claim 1, wherein the amplifier circuit includes a floating bias circuit that adjusts current flow through an output driving amplifier of the amplifier circuit causing clipping of the amplifier output signal, thereby inducing random distortion artifacts in the amplifier output signal.

10. The circuit of claim 1, wherein the amplifier circuit includes an energy conversion element operatively connected to output the amplifier output signal, which amplifier output signal increases in amplitude in direct proportion to the amplitude of the input signal until a saturation point of the energy conversion element is reached.

11. The circuit of claim 10, wherein the energy conversion element is an audio transformer such that after the saturation point of the audio tansformer is reached, further saturation of the audio transformer increases proportionally with the input signal while the regulated output signal remains substantially constant, causing emulation of power amplifier saturation and overload that produce the desired artifacts.

12. A method of controlling a power supply in a preamplifier component, comprising the steps of:
   regulating a power signal with a regulator circuit, the regulator circuit receiving a regulator control signal and producing a regulated output signal;
   operating an amplifier circuit with the regulated output signal, the amplifier circuit receiving an input signal and outputting an amplifier output signal;
   converting the amplifier output signal to a control voltage with a converter, the converter receiving the amplifier output signal and isolating the control voltage from the amplifier output signal with a buffer; and
   varying the cool voltage with a variable control circuit, the variable control circuit receiving the control voltage and varying the control voltage to output the regulated control signal to the regulator circuit;
   wherein a signal fluctuation in the input signal causes a corresponding signal fluctuation to be induced in the amplifier output signal.

13. The method of claim 12, wherein the regulated output voltage in the step of regulating is controlled with the control voltage, which is a DC control voltage.

14. The method of claim 13, wherein the DC control voltage is derived from an audio signal, which audio signal is the input signal.

15. The method of claim 12, wherein the control voltage in the step of converting is stored in the variable control circuit, which is an R/C network.

16. The method of claim 15, wherein the R/C network allows an operator to vary signal amplitude and signal frequency at which the control voltage acts upon the regulator circuit.

17. The method of claim 12, wherein a small signal fluctuation in the input signal in the step of operating causes a corresponding small signal fluctuation in the regulated output signal.

18. The method of claim 12, wherein a large signal fluctuation in the input signal in the step of operating causes a corresponding large signal fluctuation in the regulated output signal.

19. The method of claim 12, wherein the amplifier circuit in the step of operating includes a floating bias circuit that adjusts dynamically the bias state of an output driving amplifier of the amplifier circuit in response to the voltage fluctuation of the regulated output signal.

20. The method of claim 12, wherein the amplifier circuit in the step of operating includes a floating bias circuit that adjusts current flow through an output driving amplifier of the amplifier circuit causing clipping of the amplifier output signal, thereby inducing random distortion artifacts in the amplifier output signal.

21. The method of claim 12, wherein the amplifier circuit in the step of operating includes an energy conversion element operatively connected to output the amplifier output signal, which amplifier output signal increases in amplitude in direct proportion to the amplitude of the input signal until a saturation point of the energy conversion element is reached.

22. The method of claim 21, wherein the energy conversion element is an audio transformer such that after the saturation point of the audio transformer is reached, further saturation of the audio transformer increases proportionally with the input signal while the regulated output signal remains substantially constant, causing emulation of power amplifier saturation and overload that produce the desired artifacts.

* * * * *